(12) United States Patent
Lee (10) Patent No.: US 9,006,903 B2
(45) Date of Patent: Apr. 14, 2015

(54) SEMICONDUCTOR MEMORY DEVICE, MEMORY SYSTEM INCLUDING THE SAME AND METHOD OF MANUFACTURING THE SAME

(75) Inventor: Jae Jung Lee, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 313 days.

(21) Appl. No.: 13/599,889

(22) Filed: Aug. 30, 2012

(65) Prior Publication Data

US 2013/0334702 A1 Dec. 19, 2013

(30) Foreign Application Priority Data

Jun. 13, 2012 (KR) .................. 10-2012-0063218

(51) Int. Cl.
*H01L 29/72* (2006.01)
*H01L 27/115* (2006.01)
*H01L 23/522* (2006.01)
*H01L 29/792* (2006.01)

(52) U.S. Cl.
CPC ...... *H01L 27/11582* (2013.01); *H01L 23/5226* (2013.01); *H01L 27/11524* (2013.01); *H01L 27/11529* (2013.01); *H01L 29/7926* (2013.01)

(58) Field of Classification Search
CPC .................................................. H01L 23/5226

USPC .................................................. 257/751, 774
See application file for complete search history.

(56) References Cited

U.S. PATENT DOCUMENTS

| 6,127,070 | A * | 10/2000 | Yang et al. ........................ 430/5 |
| 8,242,028 | B1 * | 8/2012 | van Schravendijk et al. .. 438/763 |
| 2013/0295769 | A1 * | 11/2013 | Lin et al. ....................... 438/692 |
| 2014/0151887 | A1 * | 6/2014 | Fang et al. .................... 257/760 |

FOREIGN PATENT DOCUMENTS

| KR | 1020060127319 | 12/2006 |
| KR | 1020120094208 | 8/2012 |

* cited by examiner

*Primary Examiner* — Edward Wojciechowicz
(74) *Attorney, Agent, or Firm* — IP & T Group LLP (57) ABSTRACT

A semiconductor memory device of the present invention includes a first dielectric layer located on an upper surface of a semiconductor substrate including contact area and a non-contact area, an etching stop layer pattern formed to expose the first dielectric layer in the non-contact area and cover the first dielectric layer in the contact area, a contact hole extended to the semiconductor substrate of the contact area through the etching stop layer pattern and the first dielectric layer, a contact plug located in the contact hole, and a conductive line connected to the contact plug.

18 Claims, 6 Drawing Sheets

SEMICONDUCTOR MEMORY DEVICE, MEMORY SYSTEM INCLUDING THE SAME AND METHOD OF MANUFACTURING THE SAME

CROSS-REFERENCE TO RELATED APPLICATION

This application claims priority from Korean Patent Application No. 10-2012-0063218, filed on Jun. 13, 2012, the contents of which are incorporated herein by reference in its entirety.

BACKGROUND

The present invention relates to a semiconductor memory device, a memory system including the same, and a method of manufacturing the same; and more particularly, relates to a semiconductor memory device including a conductive line, a memory system including the same, and a method of manufacturing the same.

A semiconductor memory device includes conductive lines for applying a voltage to memory cells. A NAND flash memory device, which is a kind of the semiconductor memory device, includes a bit line formed of a conductive material. The bit line is connected to a memory string. The memory string includes memory cells connected in series. The bit line is located on a dielectric layer which is formed on the memory string to cover the memory string. The bit line is connected to the memory string via a contact plug connected directly to a drain area of the memory string by penetrating through the dielectric layer. Accordingly, it is important to secure overlay margin between the bit line and the contact plug.

A technique using an etching stop layer may be provided to secure the overlay margin. However, since the etching stop layer is generally made up of material having high dielectric constant, the technique may increase parasitic capacitance between the bit lines, thereby causing resistance-capacitance (RC) delay.

SUMMARY OF THE INVENTION

Exemplary embodiment of the present invention provides a semiconductor memory device capable of reducing parasitic capacitance although an etching stop layer is used, a memory system using the same, and a method of manufacturing the same.

A semiconductor memory device according to an embodiment of the present invention may includes a first dielectric layer located on a semiconductor substrate including contact area and a non-contact area; an etching stop layer pattern configured to expose the first dielectric layer in the non-contact area and to cover the first dielectric layer in the contact area; a contact hole extended to the semiconductor substrate in the contact area through the etching stop layer pattern and the first dielectric layer; a contact plug located in the contact hole; and a conductive line connected to the contact plug.

A semiconductor memory device according to another embodiment of the present invention may includes a first and a second vertical channel layers protruding from a substrate; first dielectric layers and first conductive lines alternately stacked with surrounding the first and the second vertical channel layers; a second dielectric layer arranged on the first and the second vertical channel layers with covering the first dielectric layers and the first conductive lines; an etching stop layer pattern configured to expose the second dielectric layer on the second vertical channel layer; a contact hole extended to the first vertical channel layer through the etching stop layer pattern and the second dielectric layer; a contact plug arranged in the contact hole; and a second conductive line connected to the contact plug.

A memory system according to another embodiment of the present invention may includes a semiconductor memory device configured to include a first dielectric layer arranged on a semiconductor substrate having contact area and non-contact area, an etching stop layer pattern for exposing the first dielectric layer in the non-contact area and covering the first dielectric layer in the contact area, a contact hole extended to the contact area of the semiconductor substrate through the etching stop layer pattern and the first dielectric layer, a contact plug arranged in the contact hole, and a conductive line connected to the contact plug; and a memory controller configured to control the semiconductor memory device.

A memory system according to another embodiment of the present invention may includes a semiconductor memory device configured to include a first and a second vertical channel layers protruding from a substrate, first dielectric layers and first conductive lines alternately stacked with surrounding the first and the second vertical channel layers, a second dielectric layer located on the first and the second vertical channel layers with covering the first dielectric layers and the first conductive lines, an etching stop layer pattern configured to expose the second dielectric layer on the second vertical channel layer, a contact hole extended to the first vertical channel layer through the etching stop layer pattern and the second dielectric layer, a contact plug located in the contact hole and a second conductive line connected to the contact plug; and a memory controller configured to control the semiconductor memory device.

BRIEF DESCRIPTION OF THE DRAWINGS

The above and other features and advantages of the present invention will become readily apparent by reference to the following detailed description when considered in conjunction with the accompanying drawings wherein.

DESCRIPTION OF SPECIFIC EMBODIMENTS

Hereinafter, the preferred embodiments of the present invention will be explained in more detail with reference to the accompanying drawings. Although embodiments have been described with reference to a number of illustrative embodiments thereof, it should be understood that numerous other modifications and embodiments can be devised by those skilled in the art that will fall within the spirit and scope of the principles of this disclosure.

The meaning that a layer is disposed 'on' another layer or a semiconductor substrate includes a case that the layer is directly contact with another layer or the semiconductor substrate and a case that a third layer is disposed between the layer and another layer or the semiconductor substrate. Thickness and size of each of layers in drawings are properly designed for convenience for description and definiteness. The same numerical number in drawings indicates the same element.

Figure 1:
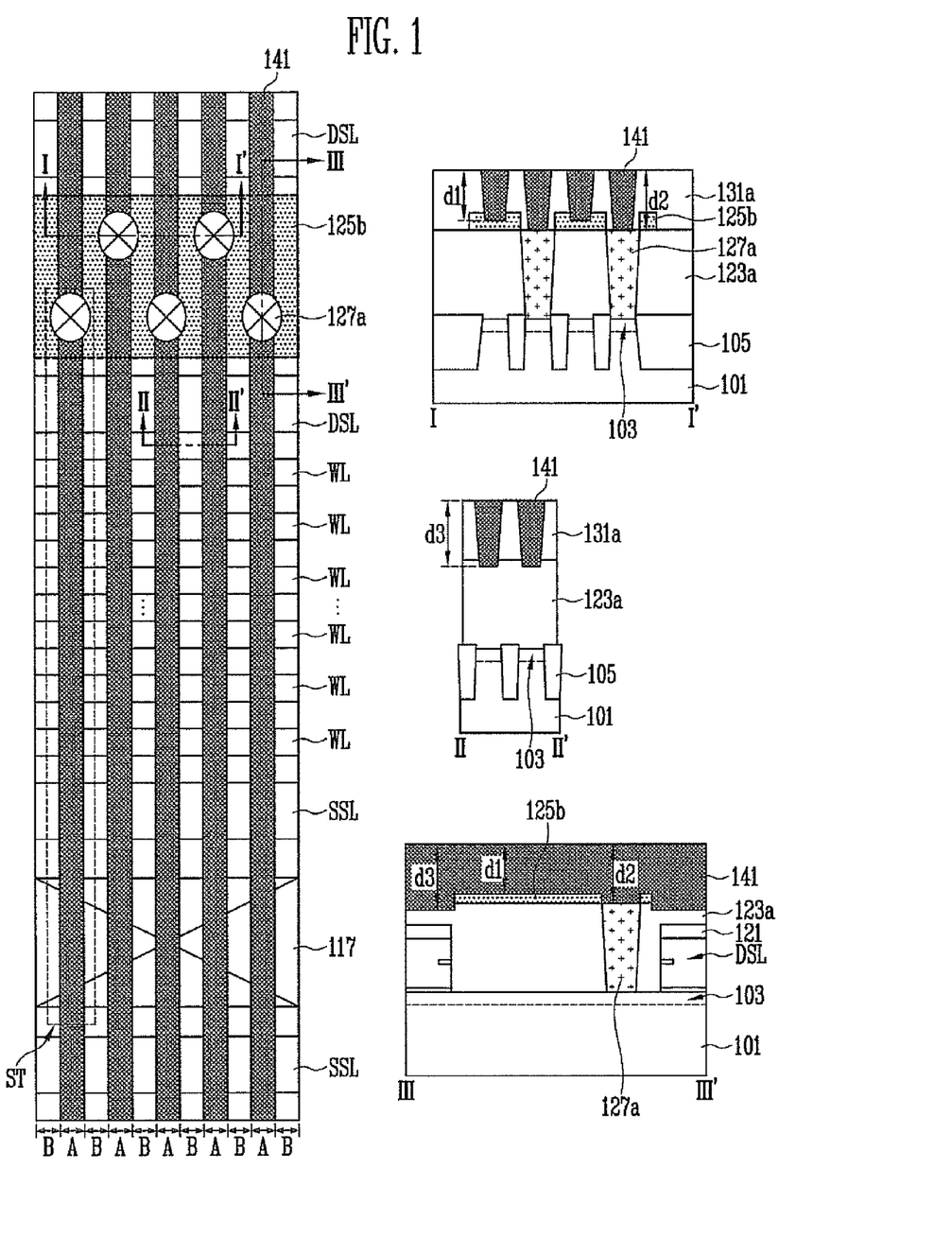
FIG. 1 is a view illustrating a semiconductor memory device according to a first embodiment of the present invention.

FIG. 1 is a view illustrating a semiconductor memory device according to a first embodiment of the present invention. Particularly, a plan view in FIG. 1 shows a part of a memory cell area of a NAND flash memory device according to a first embodiment of the present invention. Sectional views in FIG. 1 illustrate the semiconductor memory device taken along a line I-I', a line II-II' and a line III'-III' in the plan view. FIG. 1 shows two-dimensional NAND flash memory device.

In FIG. 1, a semiconductor substrate 101 in the embodiment includes a contact area and a non-contact area. The contact area means an area where contact plugs 127a is to be formed. The contact plugs 127a may be connected to a drain area of a memory string ST.

The memory string ST is formed on an active area 'A' divided by an isolation layer 105. The isolation layer 105 is a dielectric layer formed in a trench of the semiconductor substrate 101. The active area 'A' is a partial area of the semiconductor substrate 101 divided by the isolation layer 105. The isolation layer 105 and the active area 'A' may be extended in specific direction and disposed in turn.

Gate lines DSL, WL, and SSL are formed on the semiconductor substrate 101. Gate lines DSL, WL, and SSL are formed in a direction crossing the isolation layer 105 and the active area 'A'. The gate lines DSL, WL, and SSL include a drain selection line DSL, a source selection line SSL, and word lines WL formed between the drain selection line DSL and the source selection line SSL. The gate lines DSL, WL, and SSL are disposed symmetrically on the basis of the contact area. That is, the gate lines DSL, WL, and SSL disposed symmetrically at both sides of the contact area are formed.

A drain selection transistor is formed in a cross-area of the drain selection line DSL and the active area 'A'. A memory cell transistor is formed in a cross-area of the word line WL and the active area 'A'. A source selection transistor is formed in a cross-area of the source selection line SSL and the active area 'A'. A junction area 103 where impurities are injected is formed in the active area 'A' between adjoining gate lines DSL, WL, and SSL. Especially, the junction area 103 formed in the active area A between adjoining drain selection lines DSL means a drain area of the memory string ST. The junction area 103 formed in the active area A between adjoining source selection transistors SSL indicates a source area of the memory string ST. The memory string ST comprises the drain selection transistor, the source selection transistor, and memory cells connected in series between the drain selection transistor and the source selection transistor. The memory cells are connected in series through the junction areas 103 between the drain selection transistor and the source selection transistor.

A first dielectric layer 123a is formed over the semiconductor substrate 101 including the memory string ST. The first dielectric layer 123a may be formed by laminating two or more dielectric material layers. For example, the first dielectric layer 123a may include a first material layer and a second material layer which is formed on the first material layer. The first material layer formed on the source area may be penetrated by a contact line 117. The first material layer and the second material layer formed on the drain area may be penetrated by the contact plug 127a.

The contact line 117 located between the source selection lines SSL may be extended in the same direction as the source selection line SSL. Accordingly, the source areas formed in the active areas 'A' between the source selection lines SSL may be connected in common to the contact line 117. The gate lines DSL, WL, and SSL may be formed symmetrically at both sides of the contact line 117.

The contact plug 127a is formed on each of the active areas 'A' between the drain selection lines DSL. The contact plug 127a is connected to the drain area of the junction areas 103. The contact plug 127a is formed in the contact hole for exposing the junction area 103 corresponding to the drain area. That is, the contact plug 127a penetrates through the first dielectric layer 123a. The contact holes between the drain selection lines DSL may be disposed with zigzag patterns to secure etching margin in an etching process of forming the contact holes. It is assumed that one of the drain selection lines DSL facing based on the contact holes is a first drain selection line while the other of the drain selection lines DSL is a second drain selection line. Then, disposition of the contact plugs will be described below. Odd number contact plugs, or even number contact plugs, of the contact plugs 127a formed between the first selection line and the second selection line are disposed adjacent to the first drain selection line, while the other contact plugs are disposed adjacent to the second drain selection line. As a result, shortest distance between adjoining contact plugs 127a increases, thereby preventing a defect that adjoining contact plugs 127a are connected.

An etching stop layer pattern 125b is formed on the first dielectric layer 123a. The etching stop layer pattern 125b is formed on the first dielectric layer 123a of the contact area. The etching stop layer pattern 125b exposes a first dielectric layer 123a of the non-contact area. Particularly, the etching stop layer pattern 125b is formed on the first dielectric layer 123a between the drain selection lines DSL. The etching stop layer pattern 125b may be extended in the direction where the drain selection line DSL is extended. The contact hole filled with the contact plug 127a is disposed through the etching stop layer pattern 125b. That is, the contact hole is extended to the contact area of the semiconductor substrate 101 through the etching stop layer pattern 125b and the first dielectric layer 123a. An upper surface of the contact plug 127a may be formed with the same height as or height smaller than an upper surface of the etching stop layer pattern 125b.

The second dielectric layer 131a is formed on the etching stop layer pattern 125b and the first dielectric layer 123a. The second dielectric layer 131a is penetrated by the conductive line 141. The conductive line 141 may be a bit line which is extended in parallel to the active area 'A' and connected to the contact plug 127a. Extension direction of the conductive line 141 crosses over the etching stop layer pattern 125b. Accordingly, a part of the conductive line 141 may be contact with the etching stop layer pattern 125b or the first dielectric layer 123a. The conductive line 141 may be formed by burying conductive material in the trench after forming the trench by etching the second dielectric layer 131a. A part of the etching stop layer pattern 125b and a part of the first dielectric layer 123a may be etched in a process of forming the trench. As a result, a part of the etching stop layer pattern 125b and a part of the first dielectric layer 123a, which are contacted with the conductive line 141 formed in the trench, may be formed concavely. Additionally, a thickness d2 of a first area of the conductive line 141 contacted with the contact plug 127a may be larger than a thickness d1 of a second area of the conductive line 141 contacted with the etching stop layer pattern 125b. Further, the thickness d2 may be smaller than that a thickness d3 of a third area of the conductive line 141 contacted with the first dielectric layer 123a.

In the semiconductor memory device according to the first embodiment, the etching stop layer pattern 125b remains in the contact area. However, the etching stop layer pattern 125b is not formed in the non-contact area as described above. Accordingly, area of the etching stop layer pattern 125 formed between the conductive lines 141 may reduce. Thus, a parasitic capacitance between the conductive lines is reduced. As a result, interference between the conductive lines 141 may reduce. Furthermore, the semiconductor memory device of the first embodiment may improve RC delay by reducing the parasitic capacitance. The semiconductor memory device of the first embodiment may secure an overlay margin between the conductive lines 141 and the contact plugs 127a by the etching stop layer pattern 125b remaining in the contact area.

As described above, in the semiconductor memory device of the first embodiment, the thickness d3 of the third area of the conductive line 141 is larger in an area where the etching stop layer pattern 125b does not remain. Thus, resistance of the conductive line 141 may reduce. The semiconductor memory device of the first embodiment may improve the RC delay by reducing resistance of the conductive line 141.

FIG. 2a to FIG. 2e are sectional views illustrating a method of manufacturing the semiconductor memory device according to the first embodiment of the present invention.

Figure 2A:
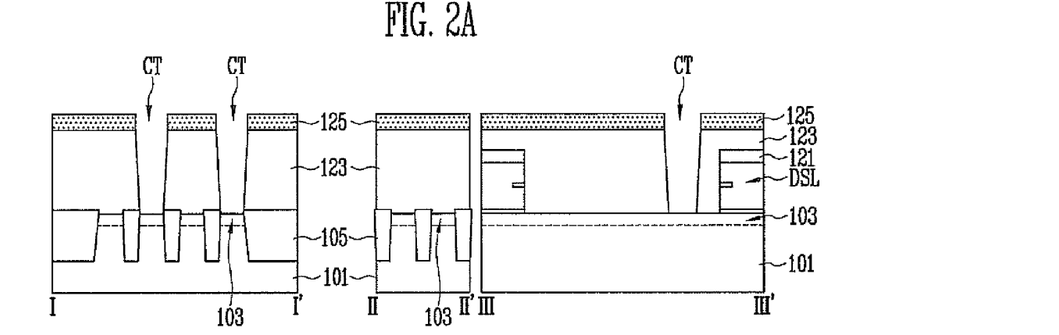
FIG. 2a to FIG. 2e are sectional views illustrating a method of manufacturing a semiconductor memory device according to a second embodiment of the present invention.

In FIG. 2a, the gate lines DSL, WL, and SSL in FIG. 1 are formed on the semiconductor substrate 101 including the contact area and the non-contact area. The gate lines DSL, WL, and SSL may be formed on the semiconductor substrate 101 at both sides of the contact area. Hereinafter, a process of forming a NAND flash memory device, e.g., a process of forming the gate line DSL, WL and SSL, will be described in detail.

A tunnel dielectric layer and a conductive layer for the floating gate are deposited on the semiconductor substrate 101. Plural isolation mask patterns are formed on the conductive layer for the floating gate. Subsequently, isolation areas ('B' in FIG. 1) of the semiconductor substrate 101 are exposed by removing the conductive layer exposed between the isolation mask patterns and the tunnel dielectric layer. Then, the trenches are formed to the semiconductor substrate 101 by etching the isolation areas 'B'. The dielectric material is buried in the trenches. The dielectric material is flattened by a planarization process such as a chemical mechanical polishing, and the like. Thus, the isolation mask patterns are exposed. Subsequently, the isolation mask patterns are removed. Isolation layers 105 are formed with target height by controlling height of the dielectric material using the etching process. The active areas 'A' of the semiconductor substrate 101 are divided on the basis of the isolation layers 105. Then, a dielectric layer and a conductive layer for a control gate are deposited. To expose the conductive layer for the floating gate, contact holes are formed at a dielectric layer in an area where the drain selection line DSL and the source selection line SSL are to be formed before the conductive layer for the control gate is deposited. Subsequently, gate hard mask patterns 121 are formed on the conductive layer for the control gate. The gate lines DSL, WL, and SSL are formed by removing the conductive layer for the control gate, the dielectric layer, and the conductive layer of the floating gate exposed by the gate hard mask patterns 121. Adjoining drain selection lines DSL of the gate lines DSL, WL, and SSL are separated based on the contact area. Adjoining source selection lines (SSL in FIG. 1) are also separated on the basis of the contact area.

The junction areas 103 are formed by injecting impurities in the active areas 'A' between adjoining gate lines DSL, WL, and SSL using the gate lines DSL, WL, and SSL as a mask. As a result, the junction area 103 as the drain area is formed in the contact area between the drain selection lines DSL.

Subsequently, the first dielectric layer 121 and the etching stop layer 125 are formed in sequence on the semiconductor substrate 101 including the junction area 103. The first dielectric layer 121 may be an oxide layer. The etching stop layer 125 may be includes materials which have a great etch selectivity to the first dielectric layer 121 and a second dielectric layer to be formed when following etching process is performed. For example, the etching stop layer 125 may be a nitride layer.

A contact hole CT is formed by etching the first dielectric layer 121 and the etching stop layer 125. The contact hole CT is extended to the semiconductor substrate 101 through the first dielectric layer 121 and the etching stop layer 125 in the contact area.

Figure 2B:
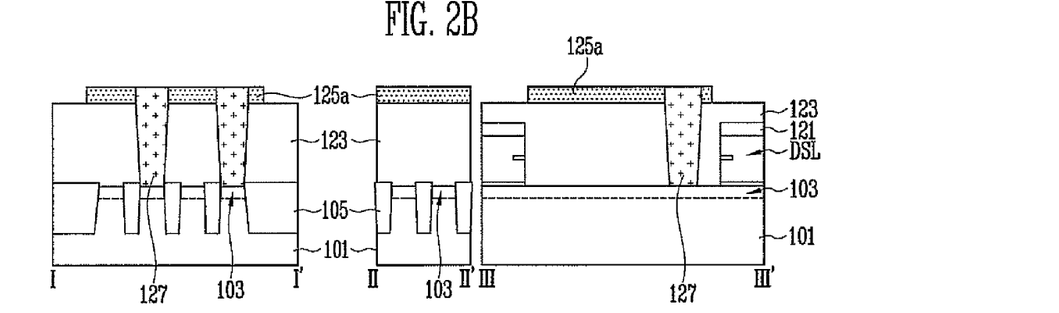

In FIG. 2b, the etching stop layer 125 is etched so that the first dielectric layer 123 in the non-contact area is exposed. As a result, the etching stop layer pattern 125a is formed on the first dielectric layer 123 in the contact area. The first dielectric layer 123 in the non-contact area is exposed. The etching stop layer pattern 125a is formed between the drain selection lines DSL. A process of forming the etching stop layer pattern 125a may be formed by etching the etching stop layer 125 using a mask as an etch barrier after the mask locates on the etching stop layer 125 in the contact area where the contact hole CT is formed. The mask may be removed after the process of etching the etching stop layer 125 is finished.

In another embodiment of the present invention, the contact hole CT may be formed after the etching stop layer pattern 125a is formed.

The contact plug 127 is formed by burying the conductive material in the contact hole and flattening the conductive material. Herein, an upper surface of the contact plug 127 has the same height as an upper surface of the etching stop layer pattern 125a. In the first embodiment, the contact plug 127 is formed after the etching stop layer pattern 125a is formed. Thus, the height of the contact plug 127 is not changed by the etching process of forming the to etching stop layer pattern 125a.

Figure 2C:
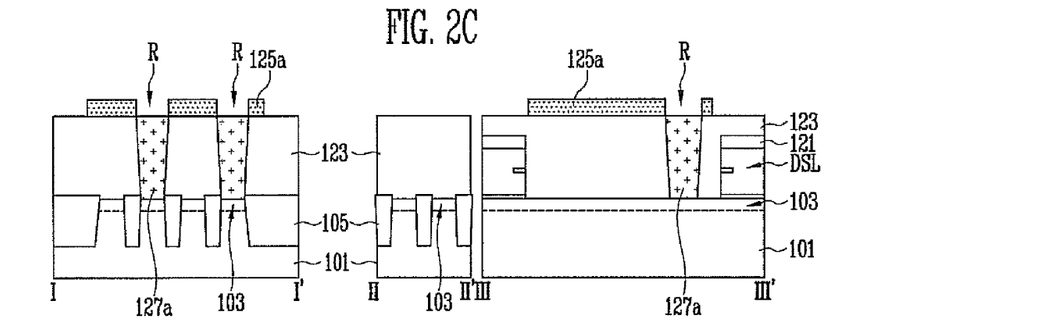

In FIG. 2c, a recess area R may be formed further by etching a part of the contact plug 127. As a result, the height of the upper surface of the remaining contact plug 127a is lower than that of the etching stop layer 125. Side walls of the etching stop layer 125 may be exposed.

Figure 2D:
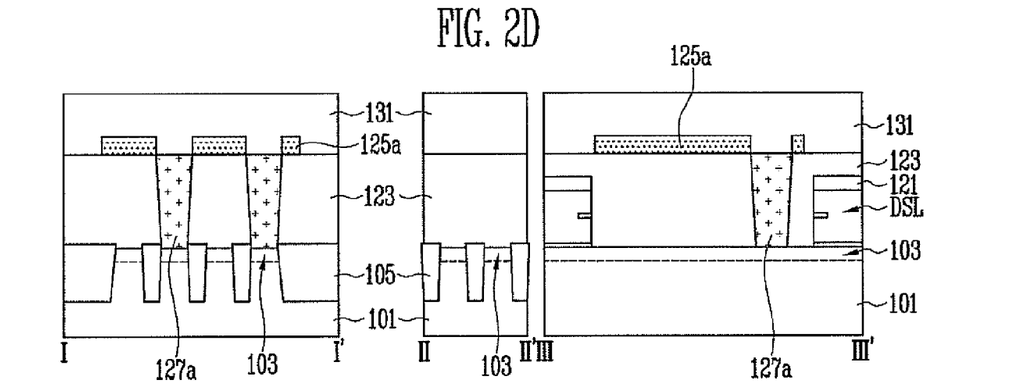

In FIG. 2d, the second dielectric layer 131 for covering the etching stop layer pattern 125a and the first dielectric layer 121 is formed. The recess area R may be filled with the second dielectric layer 131. The second dielectric layer 131 may function as an oxide layer.

Figure 2E:
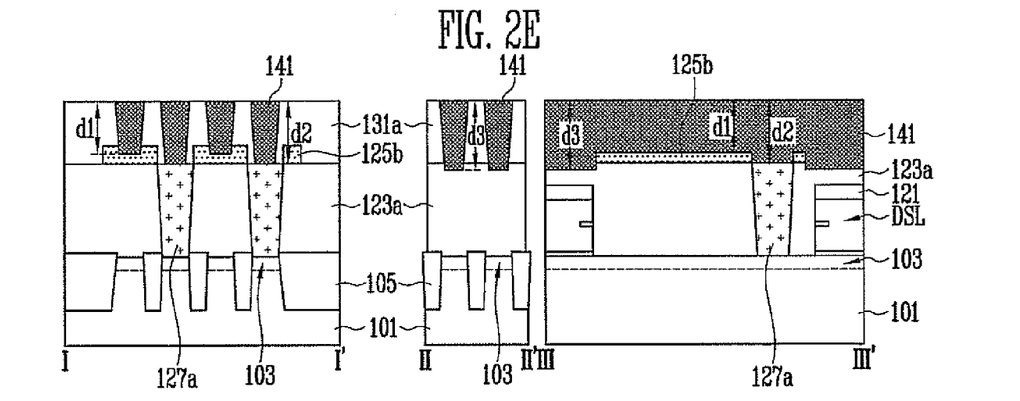

In FIG. 2e, the trench for exposing the contact plug 127a is formed by etching the second dielectric layer 131. A conductive line 141 is formed by filling conductive material in the trench.

In the etching process of forming the trench, the second dielectric layer 131 may be etched with velocity rapider than the etching stop layer pattern 125b. Otherwise, the etching process may be performed using etching material which etches only the second dielectric layer 131. Accordingly, the etching process of forming the trench for exposing the contact plug 127a may be performed to remain the etching stop layer pattern 125b. As a result, though a space between adjoining contact plugs 127a is narrow, only the target contact plug 127a in each trench may be exposed because the etch process of forming the trench is stopped when the etching stop layer pattern 125b is exposed. Since the height of the upper surface of the contact plug 127a is lower than that of the etching stop layer pattern 125b, only the target contact plug 127a in each trench may be exposed by the etching stop layer pattern 125b remaining between the trenches in a case when the trench is extended inside the contact hole CT. Particularly, the etching stop layer pattern 125b is exposed through the side walls of the trench during the etching process of forming the trench. The etching stop layer pattern 125b is not nearly etched by the etching material for forming the trench. Accordingly, over-etching in a direction to the side wall of the trench is prevented during the etching process of forming the trench. Thus, two or more contact plugs 127a adjacent in the direction to the side wall of the trench may be simultaneously not exposed. As a result, the semiconductor memory device of the first embodiment may secure the overlay margin between the trench and the contact plug 127a.

The trench is extended in a direction crossing the gate lines DSL, WL, and SSL. As a result, the trench may expose a part of the etching stop layer pattern 125b and a part of the first dielectric layer 123a as well as the contact plug 127a. In the etching process of forming the trench, an etching time may be controlled to further etch the part of the etching stop layer pattern 125a and the part of the first dielectric layer 123, so that an area where the conductive line 141 is to be formed may be increased in larger volume. Depth of the trench according to the etching process may be different in each of areas. That is, a depth d2 of a first area in the trench for exposing the contact plug 127a may be larger than a depth d1 of a second area in the trench for exposing the etching stop layer pattern 125b. In addition, the depth d2 may be smaller than a depth d3 of a third area in the trench for exposing the first dielectric layer 123a. As described above, resistance of the conductive line 141 may reduce by increasing the volume of the area where the conductive line 141 is formed.

Figure 3:
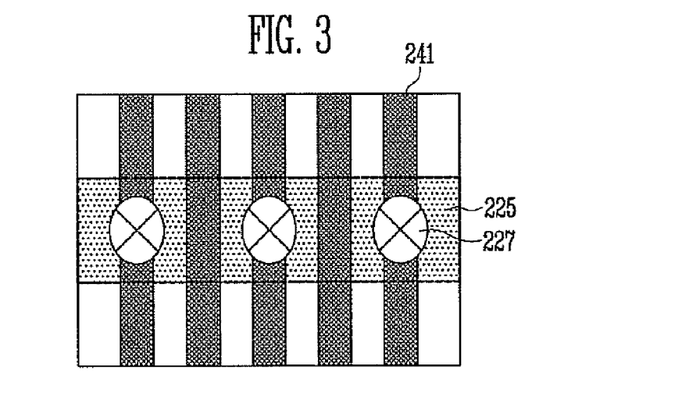
FIG. 3 is a view illustrating a semiconductor memory device according to a third embodiment of the present invention.

FIG. 3 is a view illustrating a semiconductor memory device according to a second embodiment of the present invention. Especially, a method in FIG. 3 may be applied to a peripheral area where driving transistors for driving the NAND flash memory device are formed as well as a cell array area of the NAND flash memory device in the first embodiment.

In FIG. 3, source areas or drain areas of the driving transistors formed in the peripheral area may be connected to a metal line 241 formed on the contact plug 227 through the contact plug 227 formed thereon. Here, the etching stop layer 225 is formed in only the contact area in the peripheral area where the contact plugs 227 are formed. The etching stop layer 225 is not formed in the other non-contact area.

Only the cell array area and the peripheral area of two-dimensional NAND flash memory device are described in the above description. However, the present invention is not limited as the above embodiments, and may be applied to any memory device for connecting a lower structure of the contact plug to an upper structure of the contact plug through the contact plug. For example, the present invention may be applied to three-dimensional semiconductor memory device.

Figure 4A:
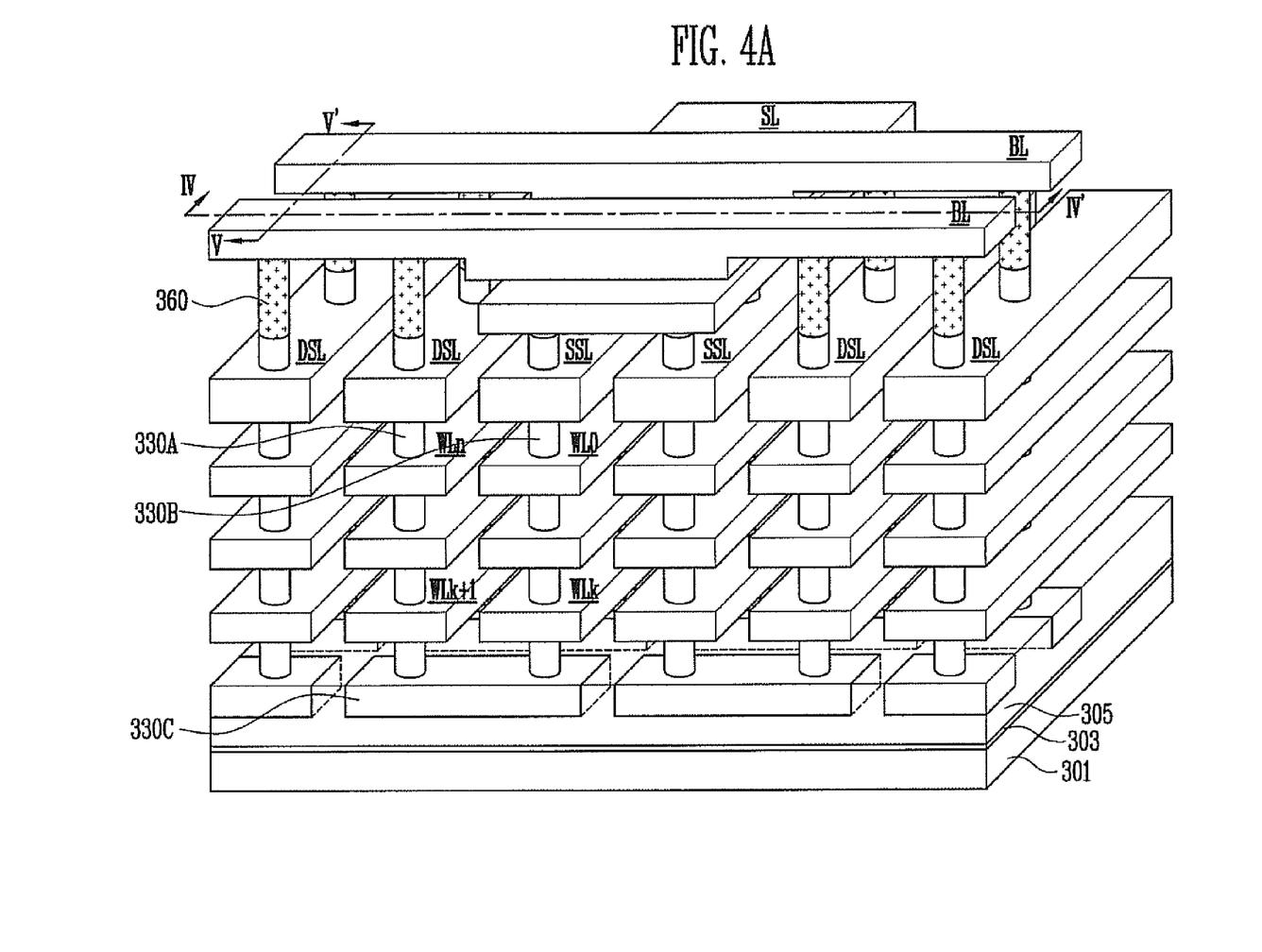
FIG. 4a to FIG. 4c are views illustrating a semiconductor memory device according to a fourth embodiment of the present invention.
Figure 4B:
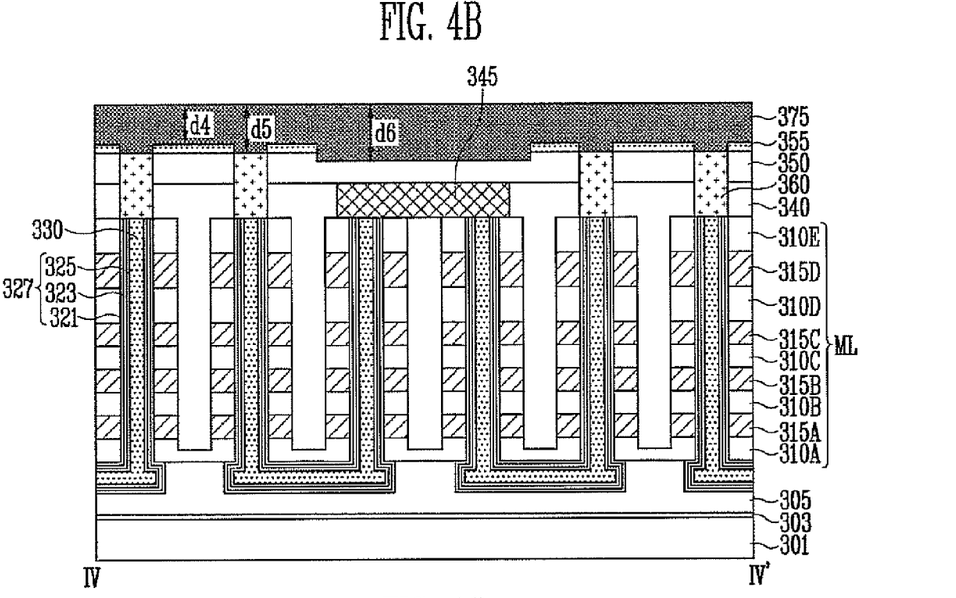
Figure 4C:
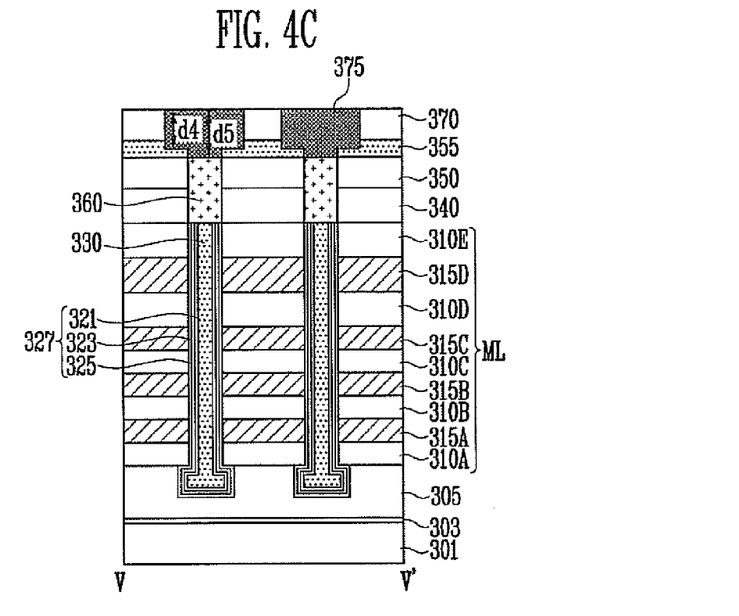

FIG. 4a to FIG. 4c are views illustrating a semiconductor memory device according to a third embodiment of the present invention. Particularly, FIG. 4a to FIG. 4c show three-dimensional semiconductor memory device including a vertical channel layer surrounded by multi-layer conductive layers. FIG. 4a illustrates a part of a memory cell area in the three-dimensional semiconductor memory device. FIG. 4b is a sectional view taken along a line IV-IV' in FIG. 4a. FIG. 4c is a sectional view taken along a line V-V' in FIG. 4a. FIG. 4a omits some of dielectric layers to described more definitely layout of conductive lines DSL, $WL_0$ to $WL_n$, SSL, BL, and SL according to the third embodiment.

In FIG. 4a to FIG. 4c, the semiconductor memory device according to the third embodiment includes a first vertical channel layer 330A and a second vertical channel layer 330B protruding in parallel on a substrate 301. The vertical channel layers 330A and 330B may be connected by a pipe channel layer 330C. External walls of the first vertical channel layer 330A, the pipe channel layer 330C and the second vertical channel layer 330B are surrounded by a multilayer 327. The multilayer 327 includes a first to a third material layers 321, 323, and 325. The third material layer 325 is contacted with the first vertical channel layer 330A, the pipe channel layer 330C, and the second vertical channel layer 330B. The third material layer 325 may be silicon oxide layer. The second material layer 323 is contacted with the third material layer 325. The second material layer 323 may be silicon nitride layer trappable electric charges. The second material layer 323 functions as a charge storage layer in an area where a memory cell is formed. The first material layer 321 is contacted with the second material layer 323. The first material layer 321 may be silicon oxide layer.

The pipe channel layer 330C is formed in a pipe gate conductive layer 305 formed on the substrate 301. A dielectric layer 303 may be further formed between the substrate 301 and the pipe gate conductive layer 305 to separate the pipe gate conductive layer 305 from the substrate 301. The pipe channel layer 330C and the pipe gate conductive layer 305 constitute a pipe transistor for connecting electrically the vertical channel layers 330A and 330B.

Each of the first and the second vertical channel layers 330A and 330B is surrounded by dielectric layers 301A to 301E and conductive lines $WL_{k+1}$ to DSL and $WL_k$ to SSL alternately stacked on the pipe gate conductive layer 305. One or more conductive lines from the uppermost layer of the conductive lines surrounding the first vertical channel layer 330A may be the drain selection line DSL. At least one conductive line from the uppermost layer of the conductive lines surrounding the second vertical channel layer 330B is the source selection line SSL. Conductive lines $WL_{k±1}$ to $WL_n$ surrounding the first vertical channel layer 330A under the drain selection line DSL and other conductive lines $WL_k$ to $WL_0$ surrounding the second vertical channel layer 330B under the source selection line SSL are word lines. Hereinafter, the word lines $WL_{k+1}$ to $WL_n$ surrounding the first vertical channel layer 330A are defined as a first word line group. The other word lines $WL_k$ to $WL_0$ surrounding the second vertical channel layer 330B are referred to as a second word line group.

The drain selection transistor is formed in cross-area of the first vertical channel layer 330A and the drain selection line DSL. The source selection transistor is formed in cross-area of the second vertical channel layer 330B and the source selection line SSL. Memory cells are formed in cross-areas of the first vertical channel layer 330A and the first word line group $WL_{k±1}$ to $WL_n$ and other cross-areas of the second vertical channel layer 330B and the second word line group $WL_k$ to $WL_0$. Accordingly, a memory string where the drain selection transistor, the memory cells and the source selection transistor are connected in series may be formed by the first vertical channel layer 330A, the pipe channel layer 330C, and the second vertical channel layer 330B.

The memory string is connected between the source line SL and the bit line BL. The source line SL and the bit line BL are conductive lines.

The source line SL is formed on the dielectric layers 310A to 310E surrounding the second vertical channel layer 330B and the conductive lines $WL_k$ to SSL. The source line SL may be connected to the second vertical channel layer 330B with contacted with the second vertical channel layer 330B. The source line SL may be connected to the second vertical channel layer 330B via the contact plug, which is not shown. The source line SL may be formed in a first trench of the dielectric layer 340. The dielectric layer 340 is formed to cover the dielectric layers 310A to 310E and the conductive lines $WL_{k+1}$ to DSL and $WL_k$ to SSL, which are alternately stacked, and the first and the second vertical channel layers 330A and 330B. The first trench exposes the second vertical channel layer 330B. The first trench may be extendedly formed in the same direction as the conductive lines $WL_{k\pm1}$ to DSL and $WL_k$ to SSL.

A dielectric layer 350 is further formed on a structure where the source line SL is formed. The dielectric layer 350 is formed for separating the bit line BL from the source line SL. An etching stop layer pattern 355 is further formed on the dielectric layer 350 to secure overlay margin between the bit line BL and following contact plug 360. The etching stop layer pattern 355 is not formed on an entire surface of the dielectric layer 350. The etching stop layer pattern 355 is formed on an area where the first vertical channel layer 330A is formed. The etching stop layer pattern 355 is formed to expose a part of the dielectric layer 350 formed on the source line SL and the second vertical channel layer 330B. As a result, an area of the etching stop layer pattern 355 remaining between the bit lines BL reduces. Thus, parasitic capacitance between the bit lines BL due to material for the etching stop layer pattern 355 reduces, thereby reducing interference between the bit lines BL. The overlay margin between the bit line BL and the contact plug 360 may be secured by the etching stop layer pattern 355 remaining in the area where the contact plug 360 is to be formed.

The contact plug 360 is formed to connect the bit line BL formed on the dielectric layer 350 to the first vertical channel layer 330A formed below the dielectric layer 350. The contact plug 360 is formed in the contact hole extended to the first vertical channel layer 330A through the dielectric layers 340 and 350 and the etching stop layer pattern 355. The height of an upper surface of the contact plug 360 may be the same as or lower than that of an upper surface of the etching stop layer pattern 355.

The bit line BL is connected to the contact plug 360 and is formed in a direction crossing the conductive lines $WL_{k+1}$ to DSL and $WL_k$ to SSL. The conductive line BL may be formed in a second trench of a dielectric layer 370. The dielectric layer 370 is formed to cover the contact plug 360 and the etching stop layer pattern 355. The second trench may be extended in a direction crossing the conductive lines $WL_{k+1}$ to DSL and $WL_k$ to SSL. The second trench may be formed to expose a part of the etching stop layer pattern 355 and a part of the dielectric layer 350. The bit line BL formed in the second trench may contact with the contact plug 360, a part of the etching stop layer pattern 355, and a part of the dielectric layer 350.

A part of the etching stop layer pattern 355 and a part of the dielectric layer 350 may be etched in a process of forming the second trench. As a result, a part of the etching stop layer pattern 355 contacted with the bit line BL formed in the second trench and a part of the dielectric layer 350 may be formed concavely. A thickness d5 of a first area of the bit line BL contacted with the contact plug 360 may be larger than a thickness d4 of a second area of the bit line BL contacted with the etching stop layer pattern 355. The thickness d5 may be smaller than that d6 of a third area of the bit line BL contacted with the dielectric layer 350. Accordingly, the semiconductor memory device of the third embodiment may reduce resistance of the bit line BL by forming largely the thickness d6 of the third area d6 of the bit line BL in an area where the etching stop layer pattern 355 does not remain. In addition, the semiconductor memory device of the third embodiment may improve RC delay by reducing the resistance of the bit line BL.

Hereinafter, a method of manufacturing a semiconductor memory device according to the third embodiment will be described in detail.

The dielectric layer 303 is formed on the substrate 301. The conductive layer 305 for forming a pipe gate is formed on the dielectric layer 303. A pipe trench is formed by etching the pipe gate conductive layer 305. The pipe trench is filled with a sacrificial layer (not shown).

A stack structure ML is formed by alternately stacked the dielectric layers 310A to 310E and the conductive layers 315A to 315D on the pipe gate conductive layer 305 including the sacrificial layer. At least one conductive layer 315D from an uppermost layer of the stack structure ML is a layer for forming the selection lines DSL and SSL. The conductive layers 315A to 315C below the conductive layer 315D are layers for forming word lines $WL_0$ to $WL_n$.

In another embodiment of the present invention, the stack structure ML may be formed by alternately stacked sacrificial layers and conductive layers, and which is not shown. Here, the sacrificial layer is formed in an area where a dielectric layer is to be formed. In still another embodiment of the present invention, the stack structure ML may be formed by alternately stacking dielectric layers and sacrificial layers. The sacrificial layer is formed in an area where a conductive layer is to be formed.

Subsequently, channel holes are formed by etching the stack structure ML to expose both sides of the sacrificial layer in the pipe gate conductive layer 305. The channel holes are formed for defining areas where the first vertical channel layer 330A and the second vertical channel layer 330B are to be formed. Then, the trench of the pipe gate conductive layer 305 is opened by removing the sacrificial layer in the pipe conductive gate conductive layer 305 exposed through the channel holes.

The multilayer 327 is formed by forming in sequence the first to the third material layers 321, 323 and 325 along a surface of the trench of the pipe gate conductive layer 305 and surfaces of the channel holes. The channel layer 330 is formed in the trench of the pipe gate conductive layer 305 and the channel holes where the multilayer 327 is formed. As a result, the pipe channel layer and the first and the second vertical channel layers 330A and 330B which are connected by the pipe channel layer 330C are formed.

A line typed slit is formed by etching the stack structure ML between adjoining first vertical channel layer 330A and the second vertical channel layer 330B.

In a case when the stack structure ML is formed with the dielectric layers 310A to 310E and the conductive layers 315A to 315D alternately stacked, the conductive layers 315A to 315D are divided by the slit into: the conductive lines $WL_{k+1}$ to DSL surrounding the first vertical channel layer 330A; and the conductive lines $WL_k$ to SSL surrounding the second vertical channel layer 330B. The dielectric layers 310A to 310E are also divided into the dielectric layers surrounding the first vertical channel layer 330A and the dielectric layers surrounding the second vertical channel layer 330B.

In a case when the stack structure ML is formed with the sacrificial layers (not shown) and the conductive layers 315A to 315D alternately stacked, the conductive layers 315A to 315D are divided by the slit into: the conductive lines $WL_{k+1}$ to DSL surrounding the first vertical channel layer 330A; and the conductive lines $WL_k$ to SSL surrounding the second vertical channel layer 330B. A process of removing exposed sacrificial layers and filling an area where the sacrificial layers are removed with the dielectric layers 310A to 310D is further performed after the slit is formed.

In a case when the stack structure ML is formed with the dielectric layers 310A to 310E and the sacrificial layers (not shown) alternately stacked, the dielectric layers 310A to 310E are divided by the slit into: the dielectric layers surrounding the first vertical channel layer 330A; and the dielectric layers surrounding the second vertical channel layer 330B. A process of removing exposed sacrificial layers and forming the conductive lines SSL, $WL_0$ to $WL_n$, and DSL by filling an area where the sacrificial layers are removed with the conductive layers 315A to 315D is further performed after the slit is formed.

Subsequently, the dielectric layer 340 is formed on the lower structure including the first and the second vertical channel layers 330A and 330B, the pipe channel layer 330C, the conductive lines SSL, $WL_0$ to $WL_n$ and DSL, and the dielectric layers 310A to 310E. Then, the first trench extended in the same direction of the conductive lines SSL, $WL_0$ to $WL_n$, and DSL is formed by etching a part of the dielectric layer 340 on the second vertical channel layer 330B. The second vertical channel layer 330B is exposed by the first trench. The dielectric layer 340 may be an oxide layer. Subsequently, a conductive material layer 345 is filled in the first trench. As a result, the source line SL is formed to overlap with the dielectric layers 310A to 310E and the conductive lines $WL_k$ to SSL surrounding the second vertical channel layer 330B. The source line SL is connected to the second vertical channel layer 330B.

The dielectric layer 350 and the etching stop layer are formed in sequence on a surface of an entire structure including the source line SL. The dielectric layer 350 may be an oxide layer. The etching stop layer may include materials having a great etch selectivity to the dielectric layers 340 and 350 under the etching stop layer and a dielectric layer 370 to be formed on the etching stop layer. For example, the etching stop layer may be a nitride layer.

A contact hole is formed by etching the dielectric layers 340 and 350 and the etching stop layer. The contact hole is extended to the first vertical channel layer 330A through the dielectric layers 340 and 350 and the etching stop layer. Subsequently, a mask is formed on an entire structure including the contact hole. The etching stop layer is etched by using the mask as the etch barrier so that the second vertical channel layer 330B and the dielectric layer 350, which are on the dielectric layers 310A to 310E, and the conductive lines $WL_k$ to SSL surrounding the second vertical channel layer 330B are exposed. Accordingly, the etching stop layer pattern 355 remains on the first vertical channel layer 330A as well as on the dielectric layers 310A to 310E and the conductive lines DSL to $WL_{k+1}$ surrounding the first vertical channel layer 330A. The mask is removed after the etching stop layer pattern 355 is formed.

In another embodiment of the present invention, after the etching stop layer pattern 355 is formed, a contact hole, extended to the first vertical channel layer 330A through the etching stop layer pattern 355 and the dielectric layers 340 and 350, may be formed.

Subsequently, the contact plug 360 is formed in the contact hole. The contact plug 360 may be formed with the same height as the upper surface of the etching stop layer pattern 355 by burying conductive material in the contact hole and flattening the conductive material. In another embodiment of the present invention, a process of etching a part of the contact plug may be further performed after the contact plug is formed with the same height as an upper surface of the etching stop layer pattern 355. Here, the contact plug 360 may be formed with an upper surface having a height lower than the upper surface of the etching stop layer pattern 355 as shown in drawing. In the third embodiment of the present invention, the contact plug 360 is formed after the etching stop layer pattern 355 is formed. Thus, the height of the contact plug 360 may be not changed due to the etching process for forming the etching stop layer pattern 355.

Then, the dielectric layer 370 covering the etching stop layer pattern 355 and the dielectric layer 350 is formed. The dielectric layer 370 may be an oxide layer. A second trench for exposing the contact plug 360 is formed by etching the dielectric layer 370. The bit line BL is formed by filling conductive material 375 in the second trench.

In the etching process of forming the second trench, the dielectric layer 370 may be etched with velocity rapider than the etching stop layer pattern 355. Otherwise, the etching process may be performed using etching material which etches only the dielectric layer 370. Accordingly, the etching process of forming the second trench for exposing the contact plug 360 may be performed to remain the etching stop layer pattern 355. As a result, only the target contact plug 360 in each of the second trenches may be exposed through the etching stop layer pattern 355 in the third embodiment, like in the first embodiment. Thus, the semiconductor memory device may secure overlay margin between the second trench and the contact plug 360.

The second trench is extended in a direction crossing the conductive lines DSL, $WL_0$ to $WL_n$ and SSL, thereby exposing a part of the etching stop layer pattern 355 and a part of the dielectric layer 350 as well as the contact plug 360. In the etching process of forming the second trench, an area where bit line BL is to be formed may be formed with larger volume by etching more the part of the etching stop layer pattern 355 and the part of the dielectric layer 350 exposed by the second trench by controlling an etching time, and the like. Depth of the second trench according to the etching process may be different in each area. That is, the depth d5 of a first area in the second trench for exposing the contact plug 360 may be larger than the depth d4 of a second area in the second trench for exposing the etching stop layer pattern 355. The depth d5 may be smaller than the depth d6 of a third area in the second trench for exposing the dielectric layer 350.

Figure 5:
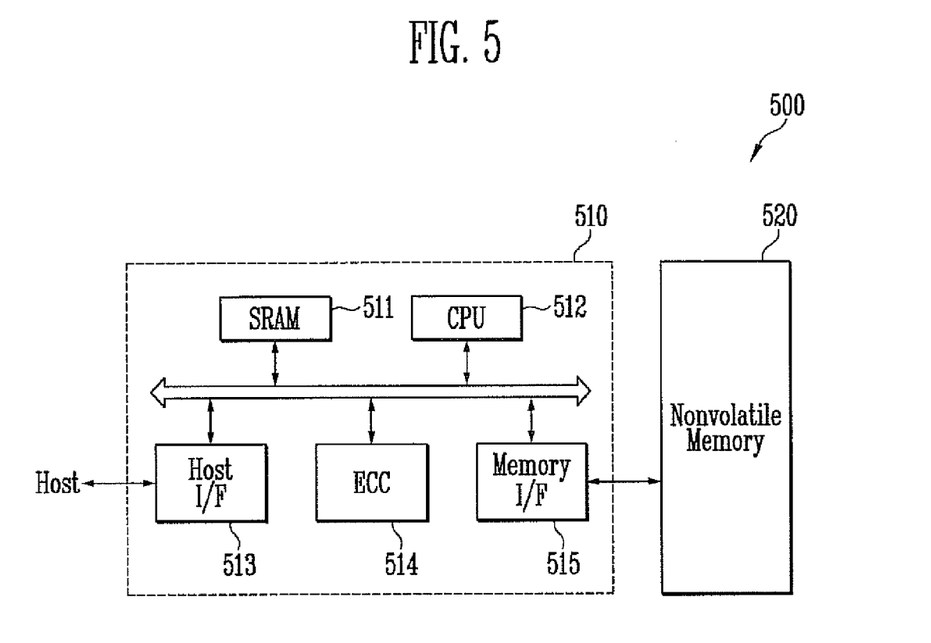
FIG. 5 is a block diagram illustrating schematically a memory system according to an embodiment of the present invention.

FIG. 5 is a block diagram illustrating schematically a memory system according to one embodiment of the present invention.

In FIG. 5, the memory system 500 of the present embodiment includes a memory device 520 and a memory controller 510.

The memory device 520 includes one or more of two-dimensional semiconductor memory device in FIG. 1 and three-dimensional semiconductor memory device in FIG. 4. That is, the memory device 520 may include the first dielectric layer 123a formed on the semiconductor substrate 101 having the contact area and the non-contact area, the etching stop layer pattern 125b for exposing the first dielectric layer 123a in the non-contact area and covering the first dielectric layer 123a in the contact area, the contact hole CT extended to the semiconductor substrate 101 in the contact area through the etching stop layer pattern 125b and the first dielectric layer 123a, the contact plug 127a formed in the contact hole CT, and the conductive line 141 connected to the contact plug 127a. The memory device 520 may include the first and the second vertical channel layers 330A and 330B protruding in parallel on the substrate 301, the first dielectric layers 310A to 310E and the first conductive lines $WL_{k+1}$ to DSL and $WL_k$ to SSL alternately stacked with surrounding each of the first and the second vertical channel layers 330A and 330B, at least one second dielectric layer 340 and 350 formed on the first and the second vertical channel layers 330A and 330B with covering the first dielectric layers 310A to 310E and the first conductive lines $WL_{k+1}$ to DSL and $WL_k$ to SSL, the etching stop layer pattern 355 formed to expose the second dielectric layer 350 on the second vertical channel layer 330B, the contact plug 360 extended to the first vertical channel layer 330A through the etching stop layer pattern 355 and the second dielectric layer 340 and 350, and the second conductive line BL connected to the contact plug 360. The first and the second vertical channel layers 330A and 330B may be connected by the pipe channel layer 330C. The second vertical channel layer 330B may be connected to the third conductive line SL.

The memory controller 510 controls data exchange between a host and the memory device 520. The memory controller 510 may include a processing unit 512 for controlling operation of the memory system 500. The memory controller 510 may include an SRAM 511 used as an operation memory of the processing unit 512. The memory controller 510 may further include a host interface 513 and a memory interface 515. The host interface 513 may have data exchange protocol between the memory system 500 and the host. The memory interface 515 may connect the memory controller 510 to the memory device 520. Furthermore, the memory controller 510 may further include an error correction block ECC 514. The error correction block 514 may detect and correct error data read from the memory device 520. The memory system 500 may further include a ROM device (not shown) for storing code data for interfacing with the host. The memory system 500 may be used as a portable data storage card. The memory system 500 may be used as a solid state disk SSD capable of replacing a hard disk in a computer system.

The present invention may secure overlay margin between a contact plug and a conductive line, using an etching stop layer.

The present invention removes a part of an etching stop layer formed on a dielectric layer so that the etching stop layer pattern remains at the peripheral of a contact plug, thereby reducing an area of the etching stop layer remaining between conductive lines. As a result, parasitic capacitance between the conductive lines may be lowered.

Although embodiments have been described with reference to a number of illustrative embodiments thereof, it should be understood that numerous other modifications and embodiments can be devised by those skilled in the art that will fall within the spirit and scope of the principles of this disclosure.

What is claimed is:
1. A semiconductor memory device, comprising:
   gate lines formed on a semiconductor substrate including a contact area, wherein the gate lines are disposed symmetrically at both sides of the contact area;
   a first dielectric layer located on a semiconductor substrate and the gate lines;
   an etching stop layer pattern extended in a direction where the gate lines are extended to expose the first dielectric layer at the both sides of the contact area and cover the first dielectric layer in the contact area;
   contact holes extended to the semiconductor substrate in the contact area through the etching stop layer pattern and the first dielectric layer;
   contact plugs located in the contact holes; and
   conductive lines connected to the contact plugs and extended in a direction crossing the etching stop layer pattern and the gate lines.

2. The semiconductor memory device of claim 1, wherein an upper surface of each of the contact plugs is formed with the substantially same height as or lower height than an upper surface of the etching stop layer pattern.

3. The semiconductor memory device of claim 1, further comprising
   a second dielectric layer formed to cover the etching stop layer pattern and the first dielectric layer and penetrated by the conductive lines.

4. The semiconductor memory device of claim 1, wherein the conductive lines are extended to an upper surface of the etching stop layer pattern and the first dielectric layer with substantially contacted with the etching stop layer pattern and the first dielectric layer.

5. The semiconductor memory device of claim 4, wherein thicknesses of first areas of the conductive lines substantially contacted with the contact plugs are larger than thicknesses of second areas of the conductive lines contacted with the etching stop layer pattern, and
   wherein the thicknesses of the first areas are smaller than thicknesses of third areas of the conductive lines substantially contacted with the first dielectric layer.

6. The semiconductor memory device of claim 4, wherein a part of the etching stop layer pattern substantially contacted with the conductive lines includes a concave shape.

7. The semiconductor memory device of claim 4, wherein a part of the first dielectric layer substantially contacted with the conductive lines includes a concave shape.

8. The semiconductor memory device of claim 1, wherein the conductive lines include a bit line of a NAND flash memory device or a metal line connected to a driving transistor of the NAND flash memory device.

9. The semiconductor memory device of claim 1,
   wherein the gate lines include drain selection lines with the contact region interposed between the drain selection lines.

10. A semiconductor memory device, comprising:
    a first and a second vertical channel layers protruding from a substrate;
    first dielectric layers and first conductive lines alternately stacked with surrounding the first and the second vertical channel layers;
    a second dielectric layer arranged on the first and the second vertical channel layers with covering the first dielectric layers and the first conductive lines;
    an etching stop layer pattern formed to expose the second dielectric layer on the second vertical channel layer;
    a contact hole extended to the first vertical channel layer through the etching stop layer pattern and the second dielectric layer;
    a contact plug arranged in the contact hole; and
    a second conductive line coupled to the contact plug.

11. The semiconductor memory device of claim 10, further comprising:

a pipe channel layer for connecting the first vertical channel layer to the second vertical channel layer.

12. The semiconductor memory device of claim 10, wherein an upper surface of the contact plug is formed with the substantially same height as or lower than an upper surface of the etching stop layer pattern.

13. The semiconductor memory device of claim 10, wherein the second conductive line is coupled to the contact plug, which is extended in a direction crossing the first conductive lines with substantially contacted with an upper surface of the etching stop layer pattern and the second dielectric layer.

14. The semiconductor memory device of claim 13, wherein thickness of a first area of the second conductive line substantially contacted with the contact plug is larger than that of a second area of the second conductive line contacted with the etching stop layer pattern, and the thickness of the first area is smaller than that of a third area of the second conductive line substantially contacted with the second dielectric layer.

15. The semiconductor memory device of claim 13, wherein a part of the etching stop layer pattern substantially contacted with the second conductive line includes a concave shape.

16. The semiconductor memory device of claim 13, wherein a part of the second dielectric layer substantially contacted with the second conductive line includes a concave shape.

17. A memory system comprising:
a semiconductor memory device including gate lines formed on a semiconductor substrate including a contact area, wherein the gate lines are disposed symmetrically at both sides of the contact area, a first dielectric layer located on the semiconductor substrate and the gate lines, an etching stop layer pattern extended in a direction where the gate lines are extended to expose the first dielectric layer at the both sides of the contact area and cover the first dielectric layer in the contact area, contact hole holes extended to the semiconductor substrate in the contact area through the etching stop layer pattern and the first dielectric layer, contact plugs located in the contact holes, and conductive lines connected to the contact plugs and extended in a direction crossing the etching stop layer pattern and the gate lines; and
a memory controller configured to control the semiconductor memory device.

18. A memory system comprising:
a semiconductor memory device including a first and a second vertical channel layers protruding from a substrate, first dielectric layers and first conductive lines alternately stacked with surrounding the first and the second vertical channel layers, a second dielectric layer arranged on the first and the second vertical channel layers with covering the first dielectric layers and the first conductive lines, an etching stop layer pattern formed to expose the second dielectric layer on the second vertical channel layer, a contact hole extended to the first vertical channel layer through the etching stop layer pattern and the second dielectric layer, a contact plug arranged in the contact hole, and a second conductive line coupled to the contact plug; and
a memory controller configured to control the semiconductor memory device.

* * * * *